United States Patent [19]
Kang

[11] Patent Number: 5,822,351
[45] Date of Patent: Oct. 13, 1998

[54] SURFACE EMITTING SEMICONDUCTOR LASER DIODE AND FABRICATING METHOD OF THE SAME

[75] Inventor: Seok-jin Kang, Suwon, Rep. of Korea

[73] Assignee: Samsung Electronics Co., Ltd., Suwon, Rep. of Korea

[21] Appl. No.: 555,180

[22] Filed: Nov. 8, 1995

[30] Foreign Application Priority Data

Jun. 16, 1995 [KR] Rep. of Korea .................. 1995-16041

[51] Int. Cl.$^6$ ...................................... H01S 3/19
[52] U.S. Cl. .................. 372/50; 372/46; 372/96
[58] Field of Search .................. 372/45, 50, 96, 372/46

[56] References Cited

U.S. PATENT DOCUMENTS 5,491,712  2/1996  Lin et al. .................. 372/50

*Primary Examiner*—James W. Davie
*Attorney, Agent, or Firm*—Rothwell, Figg, Ernst & Kurz

[57] ABSTRACT

A surface emitting semiconductor laser diode includes a ace emitting laser oscillating portion having a multi-quantum well area and being disposed between a pair of upper and lower reflector stacks for stable light-emitting, a photodiode portion for monitoring a laser beam emitted form the surface emitting laser oscillating portion and electrodes for a laser diode, a photodiode and ground for driving the surface emitting laser oscillating portion and photodiode portion. At least a part of the electrode for the photodiode is directly contacted on the surface of a semiconductor layer of the uppermost part of a deposited structure including the surface emitting laser oscillating portion. Thereby, a fabricating process of the device can be simplified, and the efficiency in monitoring can be maximized, since the photodiode is constituted being adjacent to window area through which a laser beam is directly emitted outward.

8 Claims, 4 Drawing Sheets

SURFACE EMITTING SEMICONDUCTOR LASER DIODE AND FABRICATING METHOD OF THE SAME

BACKGROUND OF THE INVENTION

The present invention relates to a surface emitting semiconductor laser diode where an LD (laser diode) and a PD (photodiode) are integrated on a single chip, and more particularly to a surface emitting semiconductor laser diode and a fabricating method thereof, which can solve an optical output cutting off problem around a window by constructing the PD as a Schottky diode structure utilizing a rectifying contact between metal and a semiconductor.

A semiconductor laser diode is widely used not only in an optical information processor such as a CDP (compact disc player), a LDP (laser disc player) or a VDR (video disc recorder) but also as an optical communication device. Wide such a wide use, the semiconductor laser diode is assembled into a single module with an additional PD for monitoring power of the LD in order to stabilize power in operation. In the above method for monitoring the output of the LD using the additional PD, assembling the LD and PD is cumbersome and an additional cost for the PD is incurred. To correct the above problems, a study of a monolithic integration of the LD and PD in fabrication of a surface emitting semiconductor laser has been vigorously undertaken.

FIG. 1 is a cross section showing a conventional surface emitting semiconductor laser diode. Referring to the drawing, an n-electrode 11 for an LD, which is made of ohmic metal formed by depositing AuGe and Au, is disposed in the lowermost portion of the device. An n-GaAs substrate 12 is deposited on the n-electrode. Successively deposited on n-GaAs substrate 12, are: a Bragg reflector stack 13 where n-AlGaAs and n-AlAs are deposited, a GaAs (or AlGaAs) active region 14 forming a multi-quantum well for oscillating a laser beam, a Bragg reflector stack 15 where P-AlGaAs and P-AlAs are deposited, and a p-GaAs contact layer 16. A ridge 20 is formed on the center of p-GaAs contact layer 16 by depositing a GaAs intrinsic semiconductor layer 18 and an n-GaAs layer 19. Beside ridge 20, on either portion, of an upper surface of p-GaAs contact layer 16, a p-electrode 17 of ohmic metal is formed by depositing Cr (or AuZn) and Au. An n-electrode 21 for a PD of ohmic metal is formed on the surface of n-GaAs layer 19 by depositing AuGe and Au. Reference numerals 22, 23 and 24 indicate a power port for the PD, a power port for the LD and a current cut-off area, respectively.

In the conventional surface emitting semiconductor laser diode having such a structure, when forward bias is applied by n-electrode 11 for the LD and p-electrode 17 of ground electric potential, light is emitted from GaAs (or AlGaAs) active region 14. The light is emitted outward after passing through p-AlGaAs/p-AlAs Bragg reflector stack 15, p-GaAs contact layer 16, GaAs intrinsic semiconductor layer 18 and n-GaAs layer 19. In the above process, the uppermost part of pAlGaAs/p-AlAs Bragg reflector stack 15, GaAs intrinsic semiconductor layer 18 and n-GaAs layer 19 acts as a photodiode formed on the path of the emitted light. When bias is applied by n-electrode 21 for the PD and p-electrode 17, the above photodiode can be used to either modulate laser beam or monitor laser power.

FIG. 2 shows a schematic equivalent circuit diagram of the conventional surface emitting semiconductor laser diode having the LD and PD of FIG. 1. Referring to the drawing, when photodiode current $I_p$ is applied to a feedback circuit for controlling laser diode current $I_L$, the integrated structure of FIG. 1 behaves as a self-monitoring laser. On the other hand, if modulated bias voltage is applied between photodiode voltage $V_{PD}$ and the ground, variation in the bias will change absorption coefficient and refractive index of the photodiode, thereby modulating the amplitude and/or phase of the laser output. In this mode, the integrated structure acts as an integrated laser and a modulator.

Such a conventional surface emitting semiconductor laser diode has a merit of monitoring directly the laser beam emitted upward by a P-I-N type photodiode formed through additional crystal growth above an emitting region. However, since the light being emitted outward is considerably absorbed while passing the P-I-N type photodiode, the quantum efficiency of the device is sharply reduced. The additional crystal growth is also cumbersome in fabrication process of the device.

SUMMARY OF THE INVENTION

To solve the above problems, it is an object of the present invention to provide a surface emitting semiconductor laser diode and a fabricating method thereof, by which a fabricating process can be simplified and a drop in the quantum efficiency of the device can be prevented.

Accordingly, to achieve the above object, there is provided a surface emitting semiconductor laser diode, comprising a surface emitting laser oscillating portion having a multi-quantum well area and being disposed between a pair of upper and lower reflector stacks for stabilizing light-emission, a photodiode portion for monitoring a laser beam emitted from the surface emitting laser oscillating portion, and electrodes for a laser diode, a photodiode and ground for driving the surface emitting laser oscillating portion and photodiode portion, wherein at least a part of the electrode for the photodiode is directly contacted on the surface of a semiconductor layer of the uppermost part of a deposited structure including the surface emitting laser oscillating portion.

Also, to achieve the above object, there is provided a method of fabricating a surface emitting semiconductor laser diode comprising the steps of: depositing in order and growing on a substrate an n-reflector stack, a multi-quantum well active region, a p-reflector stack and a p-contact layer; forming a current cut off area in a predetermined section of a structure formed by the depositing growth; forming a p-ohmic metal layer of a predetermined pattern for constituting an electrode for ground, on the upper surface of the p-contact layer of the structure having the current cut off area; forming an insulation layer on the upper surface and one side of said p-ohmic metal layer; and forming rectifying contact metal layers each for constituting an electrode for a laser diode and an electrode for a photodiode on the upper surface of said insulation layer and a part of the upper surface of the uppermost part of the deposited structure and beneath the substrate.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
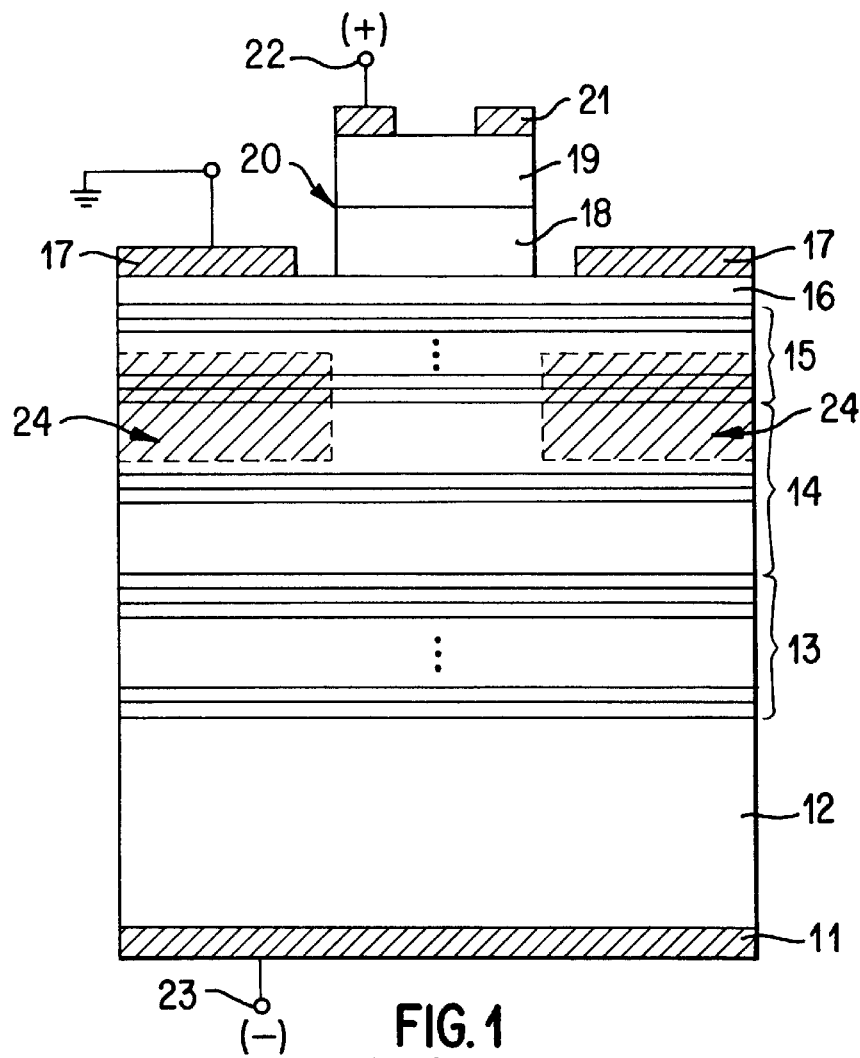
FIG. 1 is a cross section illustrating a conventional surface emitting semiconductor laser diode.
Figure 2:
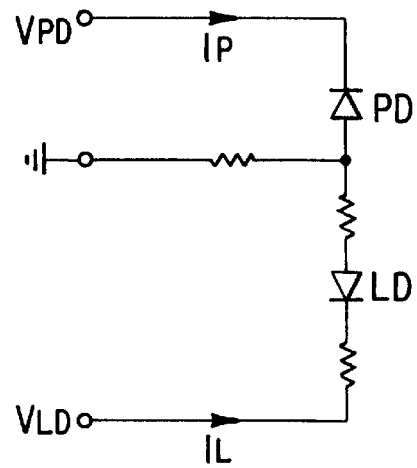
FIG. 2 is a schematic equivalent circuit diagram of the conventional surface emitting semiconductor laser diode of FIG. 1.
Figure 3:
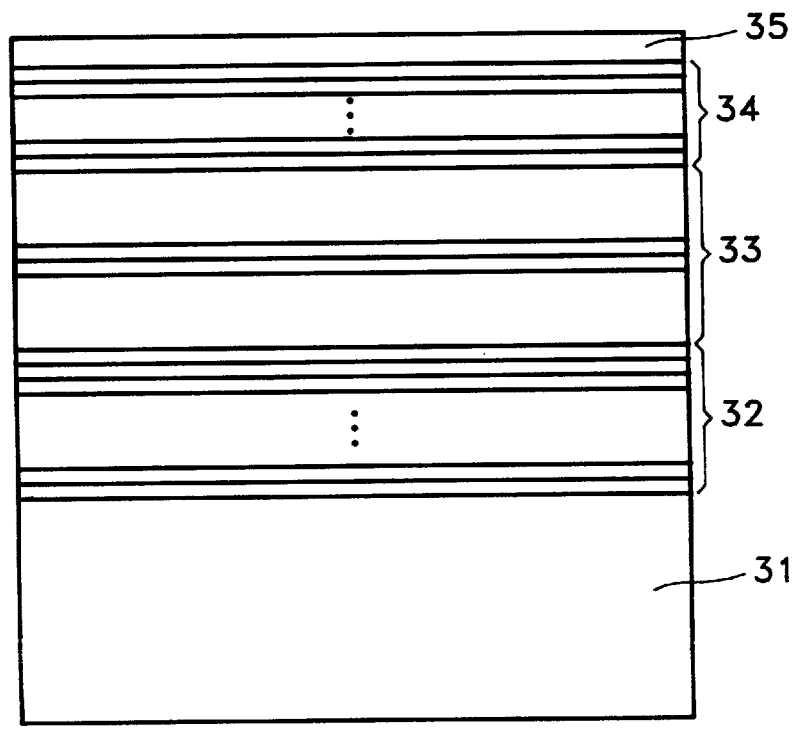
FIG. 3 is a cross section illustrating a surface emitting semiconductor laser diode after a first growth, in a fabrication method according to a first embodiment of the present invention.

Referring to FIG. 3, in order to fabricate a surface emitting semiconductor laser diode, according to a first embodiment of the present invention, an n-GaAs substrate 31 is primarily provided. The following are successively deposited and grown on substrate 31: a Bragg reflector stack 32 where n-AlGaAs and n-AlAs are deposited and for reflecting a laser beam in a predetermined direction, an active region 33 constituting a multi-quantum well as an area of oscillating the laser beam, a Bragg reflector stack 34 where p-AlGaAs and p-AlAs are deposited and for reflecting the laser beam in the predetermined direction with n-AlGaAs/n-AlAs Bragg reflector stack 34; and a p-GaAs contact layer 35 for facilitating the combination of metal and a semiconductor. Here, MBE (molecular beam epitaxy), LPE (liquid phase epitaxy) or MOCVD (metal organic chemical vapor deposition) methods are adopted in such a growth.

Figure 4:
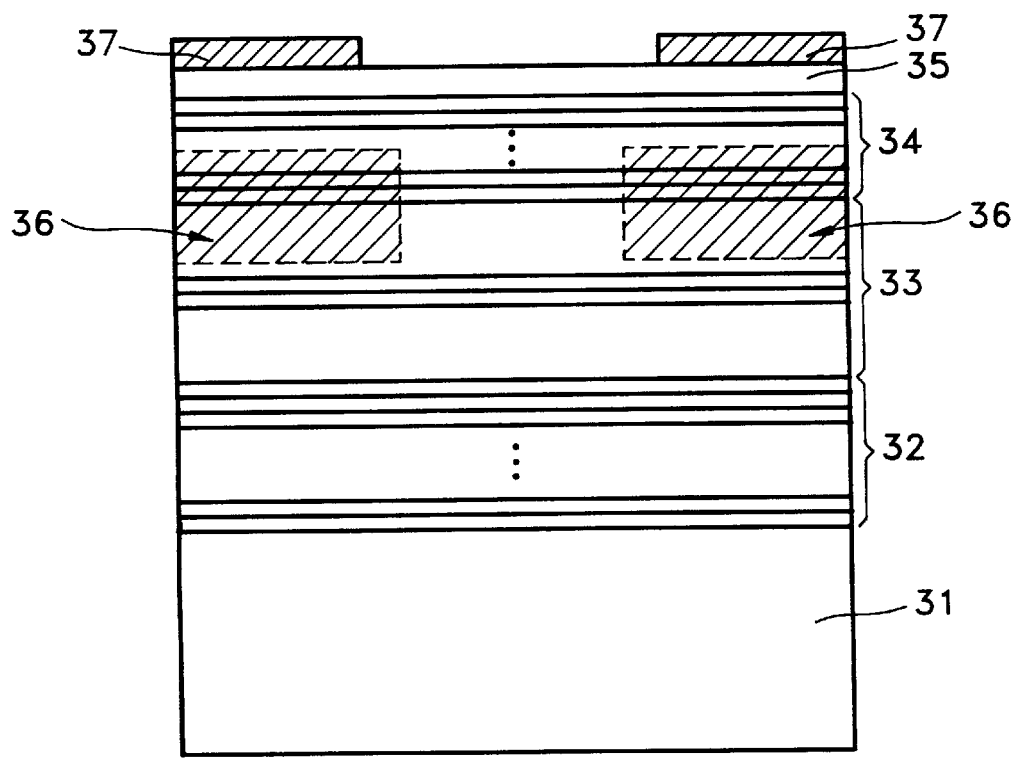
FIG. 4 is a cross section illustrating a surface emitting semiconductor laser diode after the formation of a current cut-off area and an electrode for ground, in the fabrication method according to the first embodiment of the present invention.

When a first growth is completed as described above, a current cut-off area 36 is formed through the ion implantation process in a predetermined section of a structure formed by the above deposition growth, as shown in FIG. 4. In such an ion implantation process, protons are accelerated by an ion implantation apparatus to destruct semiconductor crystal in the predetermined section of the structure, so that the section has a high resistance value. Current cut-off area 36 is for concentrating the current flowing dispersively through the device into its center portion, thereby reducing the consumption of electric power supplied for the oscillation of a laser.

On the other hand, when the formation of current cut-off area 36 is completed, a p-ohmic metal layer 37 of a predetermined pattern for constituting an electrode for ground is formed on p-GaAs contact layer 35. Here, p-ohmic metal layer 37 is formed by fixing a mask of a predetermined pattern (not shown) such as an $SiO_2$ mask on contact layer 35 and then depositing Cr (or AuZn) and Au.

Figure 5:
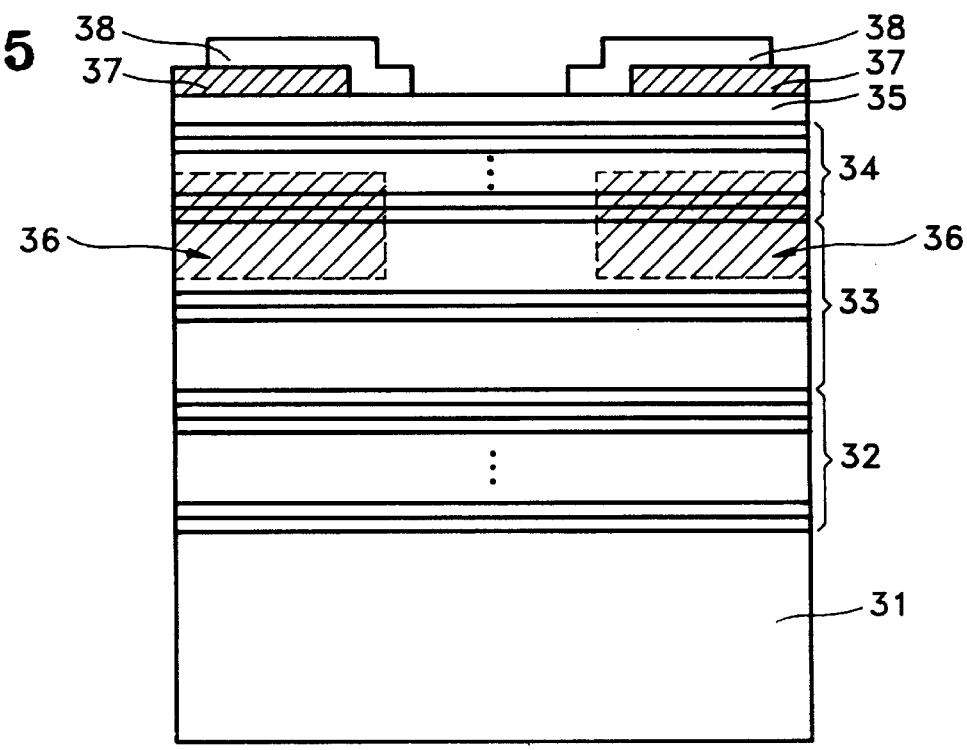
FIG. 5 is a cross section illustrating a surface emitting semiconductor laser diode after the formation of an insulation layer, in the fabrication method according to the first embodiment of the present invention.

After forming p-ohmic metal layer 37, an $SiO_2$ or $Al_2O_3$ insulation layer 38 for insulation between metal layers for electrodes is formed on the upper surface and one side of p-ohmic metal layer 37, as shown in FIG. 5.

Figure 6:
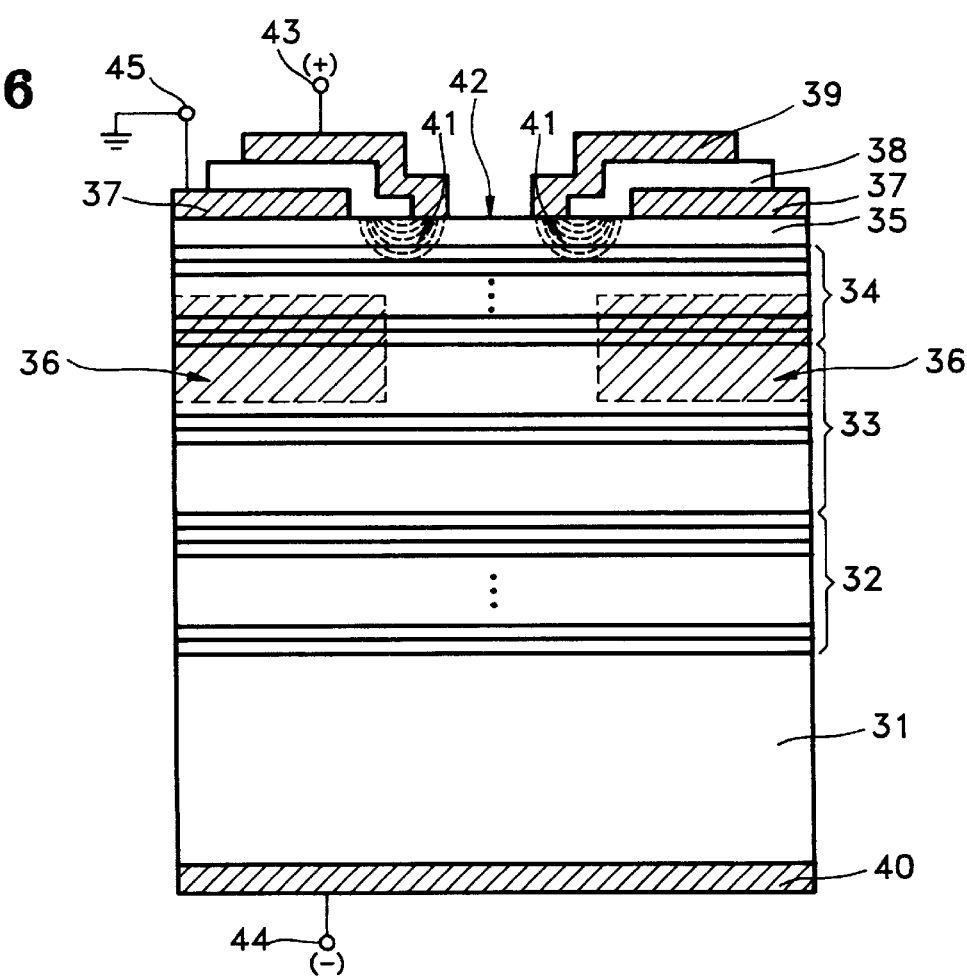
FIG. 6 is a cross section illustrating a completed structure of the surface emitting semiconductor laser diode after the formation of an electrode for a PD and an LD, in the fabrication method according to the first embodiment of the present invention.

When the formation is completed up to insulation layer 38, a rectifying contact metal layer 39 for constituting an electrode for a photodiode is formed on insulation layer 38 and on a part of the uppermost of the resultant structure, as shown in FIG. 6. An n-ohmic metal layer 40 for constituting an electrode for a laser diode is formed beneath n-GaAs substrate 31, to complete the device. Here, Rectifying contact metal layer 39 and 40 are formed by depositing AuGe and Au. Reference numerals 41 and 42 indicate a depletion area when the device is driven and a window through which the laser beam is directly emitted, respectively. Reference numerals 43 and 44 indicate ports for power supply and a reference numeral 45 indicates a port for ground.

Figure 7:
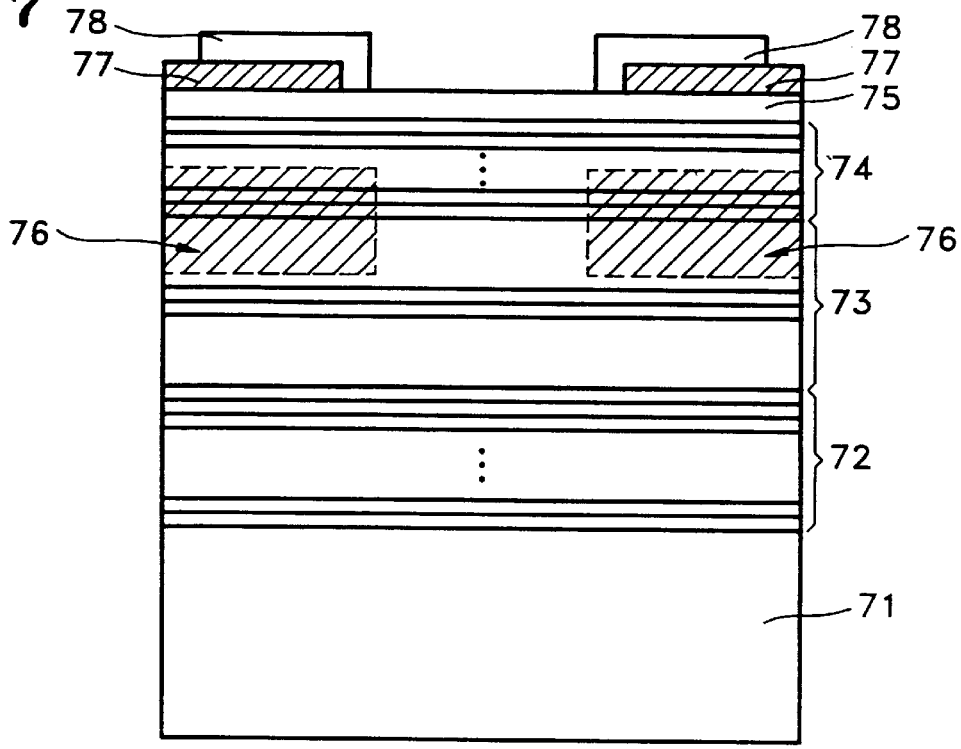
FIG. 7 is a cross section illustrating a surface emitting semiconductor laser diode after the formation of an insulation layer, in the fabrication method according to a second embodiment of the present invention.
Figure 8:
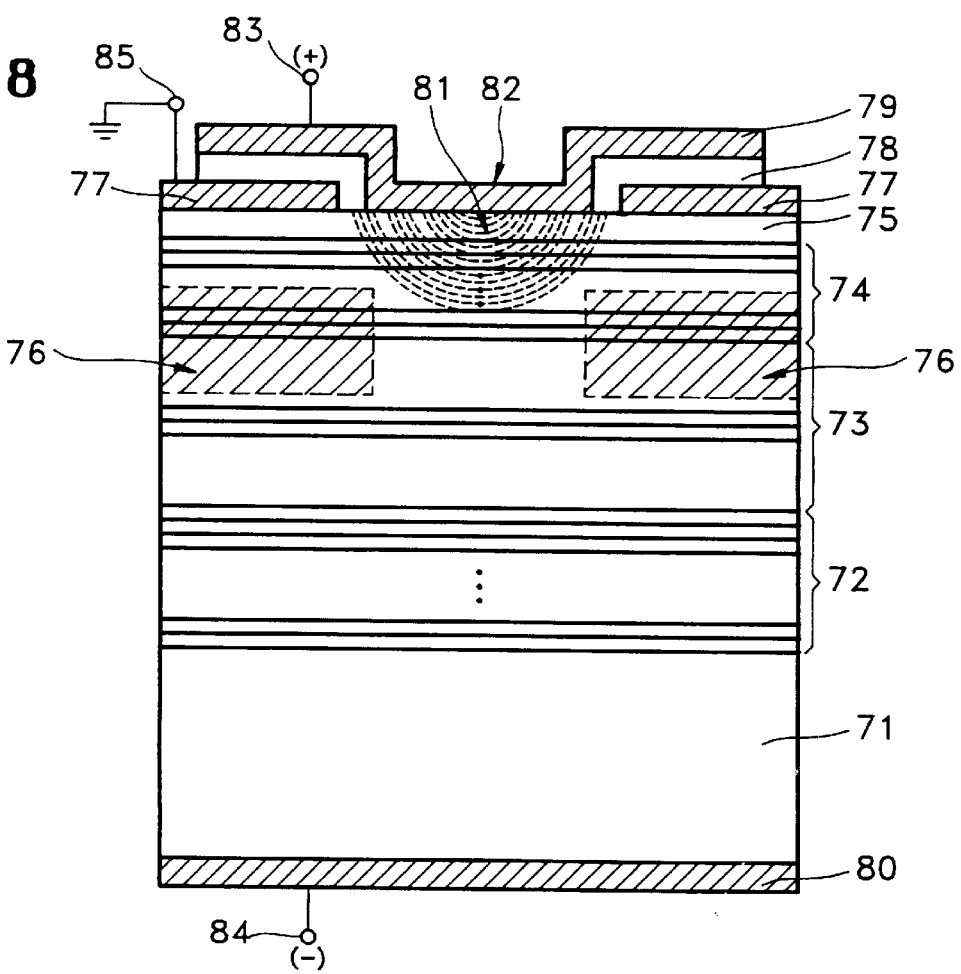
FIG. 8 is a cross section illustrating a completed structure of the surface emitting semiconductor laser diode after the formation of an electrode for a PD and an LD, in the fabrication method according to the second embodiment of the present invention.

FIGS. 7 and 8 show sectional views for illustrating the fabricating process of the surface emitting laser diode according to a second embodiment of the present invention.

In the description of the fabricating process of the second embodiment, the same portion as that of the first embodiment will be omitted.

Referring to FIG. 7, after the formation of a current cut-off area 76 and a p-ohmic metal layer 77 for constituting an electrode for ground as in the first embodiment described in FIG. 4, an $SiO_2$ or $Al_2O_3$ insulation layer 78 for insulation between metal layers for electrodes is formed on the upper surface and one side of p-ohmic metal layer 77.

After the formation is completed up to insulation layer 78, a transparent metal layer 79 of CTO (cadmium tin oxide) or ITO (indium tin oxide) for constituting an electrode for a photodiode is formed using photolithography both on the surface of insulation layer 78 and on the surface of uppermost part of the deposited structure, as shown in FIG. 8. Beneath n-GaAs substrate 71, an n-ohmic metal layer 80 is formed by depositing AuGe and Au in order to constitute an electrode for a laser diode. Reference numerals 81 and 82 indicate a depletion area in driving the device and a window through which a laser beam is directly emitted, respectively. Reference numerals 83 and 84 indicate ports for power supply and 85 indicates a port for ground.

Referring to FIGS. 6 and 8, the operation of the surface emitting semiconductor laser diode having the above structure according to the present invention, will be schematically described.

In FIGS. 6 and 8, Cr/Au (or AuZn/Au) of electrodes 37 and 77 for ground and GaAs of p-contacts 35 and 75 make resistive contacts, respectively. Between AuGe/Au (CTO or ITO) of electrodes 39 and 79 for photodiodes and GaAs of p-contacts 35 and 75, Schottky barriers each are formed to make rectifying contacts. AuGe/Au of electrodes 40 and 80 for laser diodes and GaAs of n-substrates 31 and 71 make resistive contacts, respectively.

Thus, when a forward bias is applied between electrode ports 44 and 84 for the laser diodes and electrode ports 43 and 83 for photodiodes, current is stably provided to the laser diode structure so that laser actively oscillates from active regions 33 and 73.

On the other hand, when current is applied between electrode ports 44 and 84 for the laser diodes and electrode ports 45 and 85 for ground, a laser beam over a threshold current is emitted outward. At this time, since depletion areas 41 and 81, the size of which varies according to the size of a reverse voltage value, are formed between electrode ports 45 and 85 for ground and electrode ports 43 and 83 for photodiodes, a part of the laser beam absorbed in the areas increases a reverse saturation current between electrode ports 45 and 85 for ground and electrode ports 43 and 83 for photodiodes. Since the size of the saturation current is in direct proportion to an output of the laser beam emitted outward, the output of the laser diode can be effectively controlled by varying the current between electrode ports 45 and 85 for ground and electrode ports 43 and 83 for photodiodes.

As described above, the surface emitting semiconductor laser diode and a fabricating method thereof according to the present invention can simplify the fabrication process of the device by forming a photodiode, without additional crystal growing, directly on the surface of the deposited structure using a metal-Schottky barrier caused by the combination of a semiconductor and metal. Also, since the photodiode is constituted adjacent to window areas 42 and 82, through which a laser beam is directly emitted outward, the efficiency in monitoring can be maximized.

What is claimed is:

1. A surface emitting semiconductor laser diode, comprising:
    (a) a surface emitting laser oscillating portion having a multi-quantum well area and being disposed between a pair of upper and lower reflector stacks for stable light emission;
    (b) a semiconductor contact layer formed on one of said reflector stacks; and
    (c) a photodiode portion for monitoring a laser beam emitted from said surface emitting laser oscillating portion, including
        a first electrode formed on said semiconductor contact layer,
        a metal contact layer directly contacting the entire light-emitting surface of said semiconductor contact layer, and
        an insulation layer formed between said first electrode and said metal contact layer.

2. A surface emitting semiconductor laser diode according to claim 1, wherein said electrode for the photodiode and said semiconductor layer of the uppermost part of the deposited structure make a Schottky junction.

3. A surface emitting semiconductor laser diode according to claim 1, wherein said electrode for the photodiode is formed by depositing AuGe and Au.

4. A surface emitting semiconductor laser diode according to claim 2, wherein said electrode for the photodiode is formed by depositing AuGe and Au.

5. A surface emitting semiconductor laser diode according to claim 1, wherein said electrode for the photodiode is made of transparent metal of CTO or ITO.

6. A surface emitting semiconductor laser diode according to claim 2, wherein said electrode for the photodiode is made of transparent metal of CTO or ITO.

7. A surface emitting semiconductor laser diode according to claim 1, wherein said semiconductor layer of the uppermost part is made of GaAs.

8. A surface emitting semiconductor laser diode according to claim 1, wherein said insulation layer is made of $SiO_2$ or $Al_2O_3$.

* * * * *

UNITED STATES PATENT AND TRADEMARK OFFICE
CERTIFICATE OF CORRECTION

PATENT NO. : 5,822,351
DATED : October 13, 1998
INVENTOR(S) : Seok-jin Kang

It is certified that error appears in the above-indentified patent and that said Letters Patent is hereby corrected as shown below:

Col. 1, line 17, "Wide" should be -- With

Signed and Sealed this

Fourth Day of January, 2000

Attest:

Attesting Officer

Acting Commissioner of Patents and Trademarks